US006775176B2

(12) United States Patent
Kihara (10) Patent No.: US 6,775,176 B2
(45) Date of Patent: Aug. 10, 2004

(54) SEMICONDUCTOR MEMORY DEVICE HAVING MEMORY CELLS REQUIRING NO REFRESH OPERATIONS

(75) Inventor: Yuji Kihara, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 8 days.

(21) Appl. No.: 10/262,857

(22) Filed: Oct. 3, 2002

(65) Prior Publication Data

US 2003/0185066 A1 Oct. 2, 2003

(30) Foreign Application Priority Data

Mar. 28, 2002 (JP) ........................................ 2002-090768

(51) Int. Cl.$^7$ .............................................. G11C 11/24
(52) U.S. Cl. ...................................... 365/149; 365/154
(58) Field of Search ................................ 365/149, 150, 365/154, 222

(56) References Cited

U.S. PATENT DOCUMENTS 3,876,993 A * 4/1975 Cavanaugh ................. 365/222

6,625,056 B1 * 9/2003 Kihara ........................ 365/149

FOREIGN PATENT DOCUMENTS

| JP | 63-285794 | 11/1988 |
|----|-----------|---------|
| JP | 3-34191   | 2/1991  |

* cited by examiner

Primary Examiner—Tan T. Nguyen
(74) Attorney, Agent, or Firm—McDermott Will & Emery LLP (57) ABSTRACT

A memory cell is provided with an N-channel MOS transistor as a transfer gate, a capacitor for accumulating charges corresponding to stored information, and a charge compensating circuit. Charge compensating circuit is a bi-stable circuit formed of two stages of inverters and latches a logic level of a node. Load resistors of inverters are constituted of P-channel thin film transistors made of polycrystalline polysilicon which can be formed on upper layers of N-channel MOS transistors as bulk transistors. As a result, a semiconductor memory device can realize a higher packing density and a larger capacity close to those of a DRAM without requiring refresh operations.

19 Claims, 8 Drawing Sheets

BULK Tr FORMATION REGION

TFT FORMATION REGION
BULK Tr FORMATION REGION

SEMICONDUCTOR MEMORY DEVICE HAVING MEMORY CELLS REQUIRING NO REFRESH OPERATIONS

BACKGROUND OF THE INVENTION

1. Field of the Invention

The present invention relates to a semiconductor memory device, and more particularly to a semiconductor memory device for storing information in accordance with the presence or absence of charges in a capacitor constituting of a memory cell.

2. Description of the Background Art

In a DRAM (Dynamic Random Access Memory) as a representative one of semiconductor memory devices, a memory cell is formed of one transistor and one capacitor, and the structure of a memory cell itself is simple. Consequently, the DRAM is regarded as a device which is optimum to realize higher packing density and larger capacity of a semiconductor device and used in various electronic devices.

Figure 11:
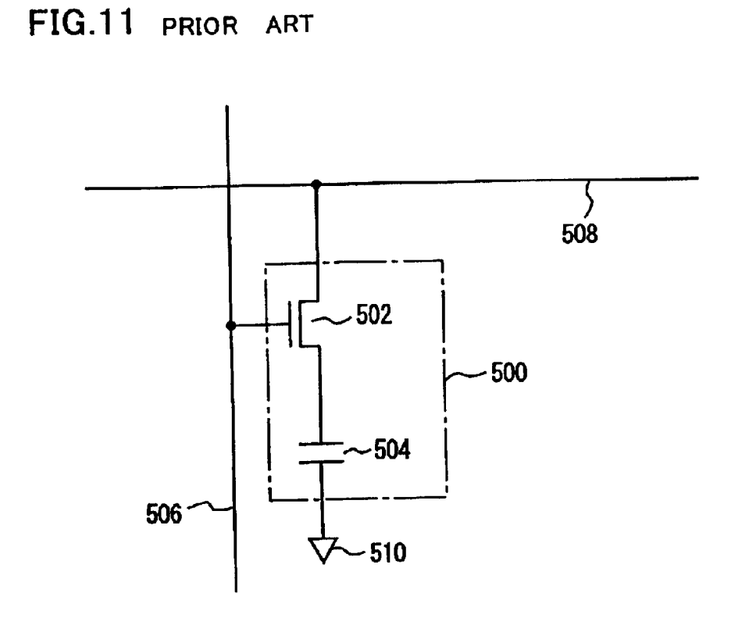
FIG. 11 is a circuit diagram showing the configuration of one of memory cells arranged in a matrix on a memory cell array in a DRAM.

FIG. 11 is a circuit diagram showing the configuration of memory cells arranged in a matrix on a memory cell array in a DRAM.

Referring to FIG. 11, a memory cell 500 is provided with an N-channel MOS transistor 502 and a capacitor 504. N-channel MOS transistor 502 is connected to a bit line 508 and capacitor 504 and has a gate connected to a word line 506. One end different from an end connected to N-channel MOS transistor 502, of capacitor 504 is connected to a cell plate 510.

N-channel MOS transistor 502 is driven by word line 506 which is activated only when data is written or read, and is turned on only when data is written or read and is off at the other times.

Capacitor 504 stores binary information "1" or "0" in accordance with whether charges are accumulated or not. A voltage corresponding to the binary information "1" or "0" is applied to capacitor 504 via N-channel MOS transistor 502 from bit line 508, thereby charging or discharging capacitor 504 to write data.

Specifically, in the case of writing data "1", bit line 508 is precharged to a power supply voltage Vcc, and word line 506 is activated, thereby turning on N-channel MOS transistor 502. Power supply voltage Vcc is applied from bit line 508 to capacitor 504 via N-channel MOS transistor 502 and charges are accumulated in capacitor 504. The state where the charges are accumulated in capacitor 504 corresponds to data "1".

In the case of writing data "0", bit line 508 is precharged to a ground voltage GND and word line 506 is activated, thereby turning on N-channel MOS transistor 502. Charges are discharged from capacitor 504 to bit line 508 via N-channel MOS transistor 502. The state where charges are not accumulated in capacitor 504 corresponds to data "0".

On the other hand, at the time of reading data, bit line 508 is previously precharged to a voltage Vcc/2 and activate word line 506 is activated, thereby turning on N-channel MOS transistor 502, and bit line 508 and capacitor 504 are energized. It makes a very small voltage change according to a charge accumulating state of capacitor 504 appear on bit line 508, and a not-illustrated sense amplifier amplifies the very small voltage change to voltage Vcc or ground voltage GND. The voltage level of bit line 508 corresponds to the state of read data.

Since the above-described data reading operation is destructive reading, word line 506 is activated again in a state where bit line 508 is amplified to voltage Vcc or ground voltage GND in accordance with the read data, and capacitor 504 is recharged by an operation similar to the above-described data writing operation. By the operation, data once destroyed by the data reading operation recovers to the original state.

In a memory cell in the DRAM, charges in capacitor 504 corresponding to stored data leak due to various causes and are gradually lost. That is, stored data decays with time. Consequently, in the DRAM, before a voltage change in bit line 508 corresponding to stored data becomes undetectable in the data reading operation, a refresh operation of reading the data once and rewriting the data is executed.

In the DRAM, all of memory cells have to always periodically be subjected to the refresh operations. This point is the drawback of the DRAM since it is disadvantageous for realize higher speed and lower power consumption. The DRAM is inferior to an SRAM (Static Random Access Memory) which does not require refresh operations from the viewpoint of high speed and low power consumption. The DRAM, however, has a simple structure of a memory cell and can be formed at a high packing density as described above. Consequently, the cost per bit is much lower as compared with other memory devices, so that the DRAM is in the mainstream of present RAMs.

On the other hand, an SRAM as also one of typical semiconductor memory devices is an RAM which does not require refresh operations indispensable for a DRAM.

Figure 12:
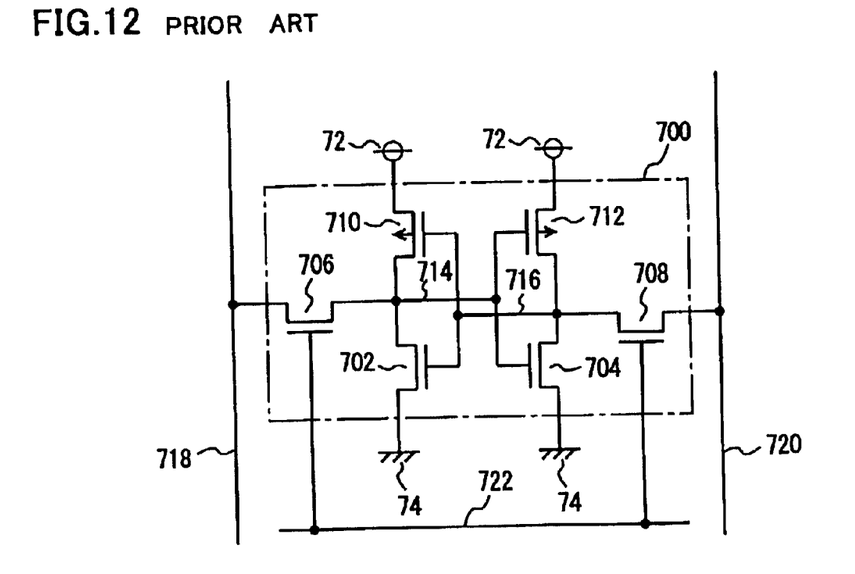
FIG. 12 is a circuit diagram showing the configuration of one of memory cells arranged in a matrix on a memory cell array in a 6-transistors SRAM.

FIG. 12 is a circuit diagram showing the configuration of one of memory cells arranged in a matrix on a memory cell array in a 6-transistors SRAM.

Referring to FIG. 12, a memory cell 700 is provided with N-channel MOS transistors 702 to 708, P-channel MOS transistors 710 and 712, and storage nodes 714 and 716.

Memory cell 700 has a configuration that a flip-flop obtained by cross-coupling an inverter formed of N-channel MOS transistor 702 and P-channel MOS transistor 710 and an inverter formed of N-channel MOS transistor 704 and P-channel MOS transistor 712 is connected to a pair of bit lines 718 and 720 via two N-channel MOS transistors 706 and 708 as transfer gates.

In memory cell 700, states of voltage levels of storage nodes 714 and 716 correspond to stored data. For example, the state where storage nodes 714 and 716 are at the H and L levels, respectively, corresponds to stored data "1", and the state where storage nodes 714 and 716 are at the L and H levels, respectively, corresponds to stored data "0". Data on cross-coupled storage nodes 714 and 716 is in a bi-stable state which is maintained as long as a predetermined power supply voltage is supplied. With respect to this point, the SRAM is fundamentally different from a DRAM in which charges stored in the capacitor dissipate with time.

In memory cell 700, in a data writing operation, voltages at opposite levels corresponding to write data are applied to the pair of bit lines 718 and 720, and word line 722 is activated to turn on transfer gates 706 and 708, thereby setting the state of the flip flop. On the other hand, a data reading operation is performed in such a manner that word line 722 is activated to turn on transfer gates 706 and 708, potentials on storage nodes 714 and 716 are transmitted to bit lines 718 and 720, and a voltage change in bit lines 718 and 720 at this time is detected.

Memory cell 700 is formed of six bulk transistors. There is also an SRAM having a memory cell which can be formed of four bulk transistors.

Figure 13:
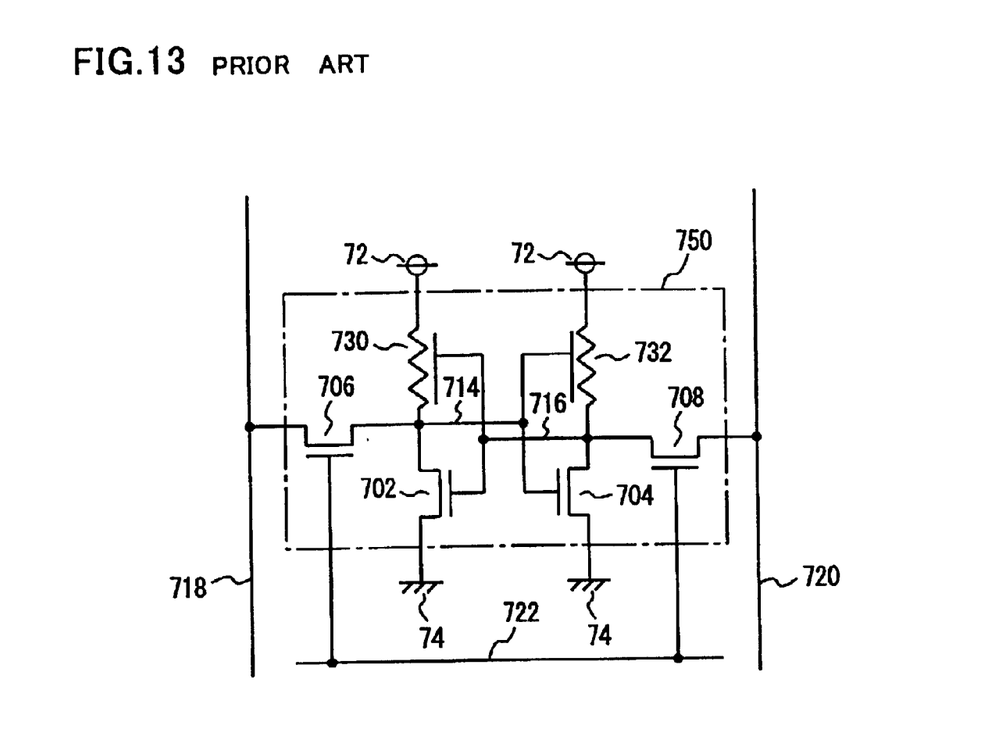
FIG. 13 is a circuit diagram showing the configuration of one of memory cells arranged in a matrix on a memory cell array in a 4-transistors SRAM.

FIG. 13 is a circuit diagram showing the configuration of one of memory cells arranged in a matrix on a memory cell array in a 4-transistors SRAM.

Referring to FIG. 13, a memory cell 750 is provided with, in place of P-channel MOS transistors 710 and 712 in memory cell 700, P-channel thin film transistors (hereinafter, referred to as "P-channel TFT") 730 and 732. As P-channel TFTs 730 and 732, resistors of high resistance may be used. "4-transistors" in the name of the 4-transistors SRAM denotes that one memory cell has four bulk transistors. "Bulk" means that a transistor is formed in a silicon substrate in contrast to the meaning that a TFT is formed on a substrate. In the following, a transistor formed in a silicon substrate will be referred to as a "bulk transistor" in contrast to thin film devices such as TFT formed on a substrate.

Since the operation principle of memory cell 750 is basically the same as that of memory cell 700, its description will not be repeated.

P-channel TFTs 730 and 732 are formed on upper layers of N-channel MOS transistors 702 and 704, so that the 4-transistors SRAM has an advantage such that its cell area is smaller than that of a 6-transistors SRAM. On the other hand, the 4-transistors SRAM has a low-voltage characteristic inferior to that of the 6-transistors SRAM. Therefore, the 4-transistors SRAM cannot cope with the tendency of lower voltage required for semiconductor memory devices of recent years and is not used so much at present.

As described above, a DRAM has a simple memory cell structure and is therefore suitable for realizing a higher packing density and a larger capacity but requires refresh operations. On the other hand, an SRAM does not require refresh operations but needs six or four bulk transistors, so that the memory cell is large. The SRAM cannot therefore cope with the demand of a higher packing density and a larger capacity. Each of DRAM and SRAM has advantages and disadvantages.

However, in future, in association with further development of IT, expectations on semiconductor memory devices satisfying higher performance (higher speed and lower power consumption), higher packing density, and larger capacity are high.

SUMMARY OF THE INVENTION

The present invention has been achieved to solve the problems and an object thereof is to provide a semiconductor memory device having memory cells realizing a higher packing density and a larger capacity close to those of a DRAM without requiring refresh operations.

According to the present invention, a semiconductor memory device is provided with: a memory cell array including a plurality of memory cells arranged in a matrix; and a plurality of word lines and a plurality of bit lines arranged in correspondence with rows and columns of the memory cells, respectively, wherein each of the plurality of memory cells includes: a capacitive element for storing data of one bit of stored information expressed by binary information and holding charges according to a logic level of the data; an access transistor driven by a voltage applied to the word line, for transferring the charges between the bit line and the capacitive element; and a charge compensating circuit for compensating charges leaked from the capacitive element in accordance with the logic level of the data.

In the semiconductor memory device according to the present invention, each of the plurality of memory cells includes the charge compensating circuit for compensating charges leaked from the capacitive element for holding charges corresponding to the logic level of stored information.

Therefore, according to the present invention, without performing refresh operations, dissipation of stored information caused by leakage of charges can be prevented.

Preferably, the charge compensating circuit includes: a first inverter having an input node connected to a storage node provided between the capacitive element and the access transistor; and a second inverter having an input node connected to an output node of the first inverter, and having an output node connected to the storage node.

The charge compensating circuit is constituted by cross-coupling the first and second inverters.

According to the present invention, therefore, the latch function is constituted by the first and second inverters, and stored information can be held at the storage node.

Preferably, an MOS transistor included in the first and second inverters is an MOS transistor of the same conductive type as that of the access transistor.

Bulk transistors constituting of a memory cell are formed of transistors of one conductive type.

According to the present invention, therefore, it is unnecessary to provide well regions of two conductive types at the time of forming a memory cell, so that the size of the memory cell can be reduced.

Preferably, the storage node has a capacity larger than that of the output node of the first inverter.

According to the present invention, therefore, the operation of writing data to a memory cell is stabilized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described in detail hereinafter with reference to the drawings. The same or corresponding parts in the diagrams are designated by the same reference numeral and its description will not be repeated.

First Embodiment

Figure 1:
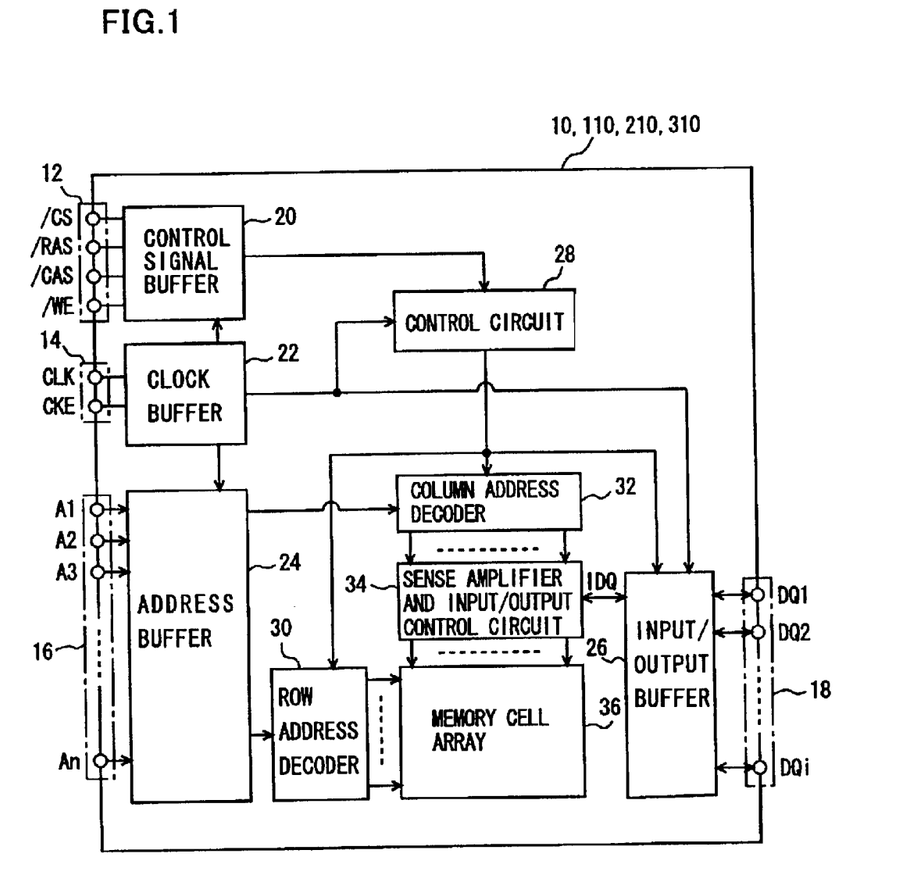
FIG. 1 is a schematic block diagram showing a general configuration of a semiconductor memory device according to a first embodiment of the present invention.

FIG. 1 is a schematic block diagram showing a general configuration of a semiconductor memory device according to a first embodiment of the present invention.

Referring to FIG. 1, a semiconductor memory device 10 is provided with a control signal terminal 12, a clock terminal 14, an address terminal 16, and a data input/output terminal 18. Semiconductor memory device 10 is also provided with a control signal buffer 20, a clock buffer 22, an address buffer 24, and an input/output buffer 26. Further, semiconductor memory device 10 is provided with a control circuit 28, a row address decoder 30, a column address decoder 32, a sense amplifier and input/output control circuit 34, and a memory cell array 36.

In FIG. 1, only main components related to data inputs and outputs of semiconductor memory device 10 are representatively shown.

Control signal terminal 12 receives command control signals of a chip select signal /CS, a row address strobe signal /RAS, a column address strobe signal /CAS, and a write enable signal /WE. Clock terminal 14 receives an external clock CLK and a clock enable signal CKE. Address terminal 16 receives address signals A0 to An (n is a natural number).

Clock buffer 22 receives external clock CLK, generates an internal clock, and outputs the internal clock to control signal buffer 20, address buffer 24, input/output buffer 26, and control circuit 28. Control signal buffer 20 takes in and latches, synchronously with the internal clock received from clock buffer 22, chip select signal /CS, row address strobe signal /RAS, column address strobe signal /CAS, and write enable signal/WE and outputs them to control circuit 28. Address buffer 24 takes in and latches address signals A0 to An synchronously with the internal clock received from clock buffer 22, generates an internal address signal, and outputs the internal address signal to row address decoder 30 and column address decoder 32.

Data input/output terminal 18 is a terminal to/from which data to be read/written from/to semiconductor memory device 10 is transmitted/received to/from the outside. Data input/output terminal 18 receives data DQ0 to DQi (i denotes a natural number) entered from the outside in data writing operation and outputs data DQ0 to DQi to the outside in a data reading operation.

Input/output buffer 26 takes in and latches data DQ0 to DQi synchronously with the internal clock received from clock buffer 22, and outputs internal data IDQ to sense amplifier and input/output control circuit 34. On the other hand, input/output buffer 26 outputs internal data IDQ received from sense amplifier and input/output control circuit 34 to data input/output terminal 18 synchronously with the internal clock received from clock buffer 22.

Control circuit 28 takes in the command control signal from control signal buffer 20 synchronously with the internal clock received from clock buffer 22, and controls row address decoder 30, column address decoder 32, and input/output buffer 26 on the basis of the taken in command control signal. By the control, data DQ0 to DQi is read/written from/to memory cell array 36.

Row address decoder 30 selects a word line on memory cell array 36 corresponding to address signals A0 to An on the basis of the instruction from control circuit 28, and activates a word line selected by a not-illustrated word driver. Column address decoder 32 selects a bit line pair on memory cell array 36 corresponding to address signals A0 to An on the basis of the instruction from control circuit 28.

In a data writing operation, sense amplifier and input/output control circuit 34 precharges the bit line pair selected by column address decoder 32 to power supply voltage Vcc or ground voltage GND in accordance with the logic level of internal data IDQ received from input/output buffer 26. Consequently, internal data IDQ is written into a memory cell in memory cell array 36 connected to the word line activated by row address decoder 30 and the bit line pair selected by column address decoder 32 and precharged by sense amplifier and input/output control circuit 34.

On the other hand, in the data reading operation, sense amplifier and input/output control circuit 34 precharges the bit line pair selected by column address decoder 32 to voltage Vcc/2 before the data reading operation, detects and amplifies a very small voltage change which generates in correspondence with read data in the selected bit line pair, determines the logic level of the read data, and outputs the resultant to input/output buffer 26.

Memory cell array 36 is a memory element group in which memory cells to be described later are arranged in a matrix, connected to row address decoder 30 via word lines corresponding to the rows, and connected to sense amplifier and input/output control circuit 34 via bit line pairs corresponding the columns.

Figure 2:
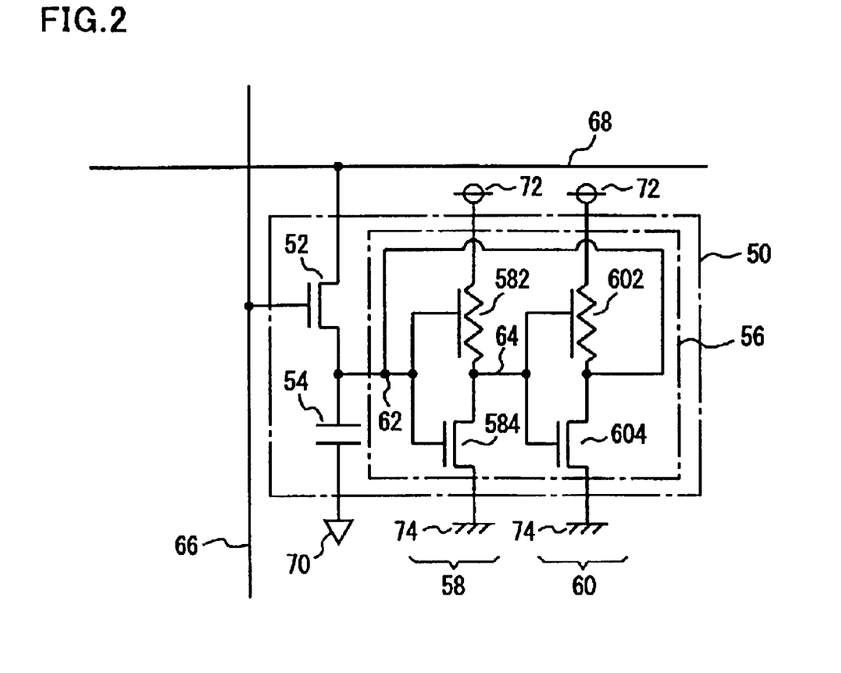
FIG. 2 is a circuit diagram showing the configuration of one of memory cells arranged in a matrix on a memory cell array in the semiconductor memory device according to the first embodiment.

FIG. 2 is a circuit diagram showing the configuration of one of memory cells arranged in a matrix on memory cell array 36 in semiconductor memory device 10.

Referring to FIG. 2, a memory cell 50 is provided with an N-channel MOS transistor 52, a capacitor 54, and a charge compensating circuit 56. Charge compensating circuit 56 includes inverters 58 and 60, and nodes 62 and 64. Inverter 58 is formed of a P-channel TFT 582 and an N-channel MOS transistor 584. Inverter 60 is formed of a P-channel TFT 602 and an N-channel MOS transistor 604.

N-channel MOS transistor 52 has a gate connected to a word line 66 and has drain and source connected to a bit line 68 and capacitor 54, respectively. N-channel MOS transistor 52 is driven by word line 66 which is activated only when data is written or read, turned on only when data is written or read, and turned off at other times.

Capacitor 54 stores binary information "1" or "0" in accordance with whether charges are stored or not. One end of capacitor 54 is connected to N-channel MOS transistor 52, and other end is connected to a cell plate 70. By applying a voltage corresponding to binary information "1" or "0" from bit line 68 to capacitor 54 via N-channel MOS transistor 52, capacitor 54 is charged/discharged, and data is written.

The configuration of N-channel MOS transistor 52 and capacitor 54 are the same as that of a general DRAM.

Each of P-channel TFTs 582 and 602 is a resistive element having a switching function made of polycrystalline polysilicon, which is a high-resistive element having an OFF-state resistance of T ("tera" indicating $10^{12}$) Ω order and an ON-state resistance of G ("giga" indicating $10^9$) Ω order.

In the present invention, a resistive element denotes both a resistive element having a switching function and a resistive element of constant resistance.

P-channel TFT 582 has a gate connected to node 62, a source connected to a power supply node 72 and a drain connected to node 64. N-channel MOS transistor 584 has a gate connected to node 62, a drain connected to node 64 and a source connected to a ground node 74.

P-channel TFT 602 has a gate connected to node 64, a source connected to power supply node 72 and a drain connected to node 62. N-channel MOS transistor 604 has a gate connected to node 64, a drain connected to node 62 and a source connected to ground node 74.

In memory cell 50, by the latch function realized by inverter 58 formed of P-channel TFT 582 and N-channel MOS transistor 584 and inverter 60 formed of P-channel TFT 602 and N-channel MOS transistor 604, a leak current of capacitor 54 is compensated, so that stored data is held without performing a refresh operation.

The operations of memory cell 50 will be described hereinafter.

(1) Writing of Data "0"

In memory cell 50, an ON-state current of a bulk transistor is approximately $3 \times 10^{-5}$ A (ampere) and an ON-state current and an OFF-state current of a TFT are approximately $1 \times 10^{-11}$ A and $1 \times 10^{-13}$ A, respectively. A leak current from nodes 62 and 64 due to the OFF-state current of capacitor 54 and the bulk transistor is approximately $1 \times 10^{-15}$ A. The current values shown here are not limited to those numerical values which are shown as degrees.

With the above-described current values, the ON-state current of each of the TFTs is higher than the leak current from each of nodes 62 and 64 by four digits. Consequently, nodes 62 and 64 can be charged to the power supply voltage from power supply node 72.

The capacity of node 62 is obtained by the capacity of capacitor 54, gate capacity of the transistor, junction capacity of the active region and the like. In order to make stored data stably read, the capacity of node 62 is designed to be at least 5 fF (5 f(femto) farad, "f" indicating $10^{-15}$) or larger. On the other hand, the capacity of node 64 is obtained by the gate capacity of a transistor, junction capacity of an active region and the like. The capacity of node 64 is approximately 1 fF as in a general SRAM. If the capacity of node 62 is the minimum value of 5 fF and the capacity of node 64 is 1 fF, the capacity ratio of nodes 62 and 64 becomes 5.

A preferable capacity ratio is determined by the condition under which data "0" can be written in memory cell 50. The condition will be described hereinafter.

When data "0" is written in memory cell 50, the voltage at node 62 becomes 0V. At the order of n (nano, "n" indicating $10^{-9}$) seconds as usual write operation time, node 64 is not charged to the power supply voltage from power supply node 72. This will be expressed by the following equation.

Assuming now that the power supply voltage of power supply node 72 is 2V, the following equation is satisfied at node 64.

Charge $Q$=Capacity $C$×Voltage $V$=1 $f$×2=2×$10^{-15}$

ON-state current $I$ of P-channel TFT 582=1×$10^{-11}$ amperes

Charging time $t=Q/I=2\times 10^{-4}$ seconds   (1)

Therefore, to charge node 64, time of the order of $\mu$ (micro, "$\mu$" indicating $10^{-6}$) seconds is required. Consequently, even when the voltage of node 62 becomes 0V, node 64 is not immediately charged to the power supply voltage. Node 62 starts to be charged via P-channel TFT 602. If the charging speed of node 62 is faster than that of node 64, node 64 is charged and, before P-channel TFT 602 is turned off, node 62 is recharged. Data "0" once written in node 62 finally becomes data "1" and a write error generates.

However, if the capacity ratio of nodes 62 and 64 is higher, the charging speed of node 64 exceeds the charging speed of node 62. Before node 62 is charged, P-channel TFT 602 is turned off and N-channel MOS transistor 604 is turned on. Consequently, node 62 is pulled down to 0V, and no write error generates.

It can be considered that the capacity ratio of nodes 62 and 64 may be approximately 5 at the minimum in consideration of variations in the threshold voltage of N-channel MOS transistors 584 and 604. To realize writing of data more stably, capacitor 54 to be connected to node 62 is provided. By setting the capacity of capacitor 54 to approximately 20 fF almost equal to that of a general DRAM, the capacity ratio of nodes 62 and 64 becomes approximately 20, and writing of data is more stabilized. Considering the facts that the ratio of the ON-state current of P-channel TFT 582 and that of P-channel TFT 602 varies by approximately 10 times and the threshold voltages of N-channel MOS transistors 584 and 604 vary, the capacity ratio of nodes 62 and 64 is desirably 20 or higher.

By setting the predetermined capacity ratio between nodes 62 and 64 as described above, even if word line 66 is made inactive before node 64 is charged to the power supply voltage, no write error in the operation of writing data "0" generates. When the voltage of node 64 exceeds a predetermined voltage, N-channel MOS transistor 604 is turned on, and node 62 is held at 0V. After that, without performing refresh operations, the state of written data "0" is maintained.

In the first embodiment, capacitor 54 is provided to stably realize writing of data. However, if the capacity ratio of nodes 62 and 64 can be sufficiently assured by the gate capacity of a transistor or the like without providing capacitor 54, capacitor 54 can be made unnecessary.

(2) Writing of Data "1"

When data "1" is written into memory cell 50, node 62 is immediately charged from bit line 68 via N-channel MOS transistor 52. Accordingly, N-channel MOS transistor 584 is immediately turned on, and the voltage at node 64 becomes immediately 0V. Therefore, the voltages of nodes 62 and 64 are stabilized early and are not influenced by the performance of a TFT at the time of writing data "1".

Since the ON-state current of P-channel TFT 602 is higher than the leak current from node 62 by four digits, node 62 is held at the power supply voltage by P-channel TFT 602. After that, without refresh operations, the state of written data "1" is held.

Figure 3:
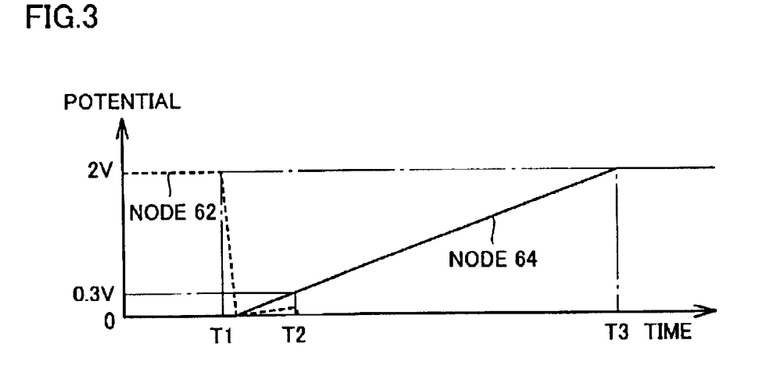
FIG. 3 is a diagram showing potential changes at nodes 62 and 64 when data "0" is written into a memory cell shown in FIG. 2.
Figure 4:
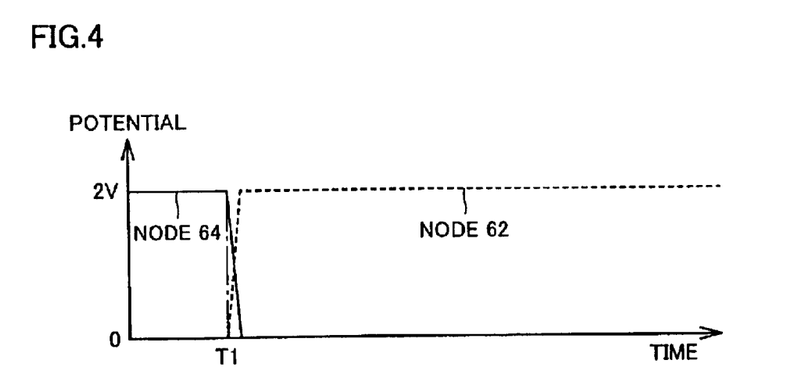
FIG. 4 is a diagram showing potential changes at nodes 62 and 64 when data "1" is written into a memory cell shown in FIG. 2.

FIGS. 3 and 4 are diagrams showing potential changes at nodes 62 and 64 in the above-described writing operation. FIG. 3 is a diagram showing potential changes at nodes 62 and 64 when data "0" is written into memory cell 50. FIG. 4 is a diagram showing potential changes at nodes 62 and 64 when data "1" is written into memory cell 50.

First, potential changes at nodes 62 and 64 when data "0" is written into memory cell 50 will be described.

Referring to FIG. 3, a broken line indicates a potential change at node 62, and a solid line indicates a potential change at node 64. It is assumed that the power supply voltage is 2V, the logic threshold voltage (an input voltage when an output voltage sharply changes) of inverter 60 is 0.3V, and word line 66 is activated at time T1.

When word line 66 is activated at time T1, charges at node 62 are pulled to bit line 68 via N-channel MOS transistor 52 and the potential at node 62 immediately becomes 0V. Accordingly, node 64 starts to be charged from power supply node 72 via P-channel TFT 582. However, since the ON-state current of the TFT is lower than the ON-state current of a bulk transistor, node 64 is not immediately charged. Consequently, node 62 also starts to be charged from power supply node 72 via P-channel TFT 602. However, in relation to the capacity ratio of nodes 62 and 64, the charging speed of node 62 is lower than that of node 64. Word line 66 is made inactive after tens $\mu$ seconds from time T1.

When the potential of node 64 exceeds a logic threshold voltage 0.3V of inverter 60 at time T2 after about $30\mu$ seconds from time T1, N-channel MOS transistor 604 is turned on, the voltage at node 62 accordingly becomes 0V, and the written data "0" is stabilized. The time of about $30\mu$ seconds required for the potential of node 64 to exceed the logic threshold voltage 0.3V of inverter 60 is confirmed on the basis of the following equations.

Charge $Q$ at node 64=Capacity $C\times$Voltage $V$=1 f$\times$0.3=3$\times10^{-16}$ ON-state current $I$ of P-channel TFT 582=1$\times10^{-11}$ A Time $t$ required for potential to reach logic threshold voltage 0.3V=$Q/I$=3$\times10^{-5}$ seconds (2)

On the other hand, node 64 is continued to be charged by P-channel TFT 582 and, as shown by the equation (1), charged to 2V of the power supply voltage at time T3 after about $200\mu$ seconds since the time at which charging of node 64 is started.

Potential changes at nodes 62 and 64 when the data "1" is written into memory cell 50 will now be described.

Referring to FIG. 4, a broken line and a solid line indicate potential changes at nodes 62 and 64, respectively, and it is assumed that word line 66 is activated at time T1. When word line 66 is activated at time T1, node 62 is immediately charged to 2V of the power supply voltage from bit line 68 via N-channel MOS transistor 52. Accordingly, N-channel MOS transistor 584 is immediately turned on and the voltage at node 64 immediately becomes 0V. Therefore, at the time of writing data "1", an influence of the characteristic of the TFT is not exerted.

(3) Reading of Stored Data

Reading of stored data in memory cell 50 can be performed by the same operations as those in a general DRAM. Specifically, bit line 68 is precharged to voltage Vcc/2 and, at the time of reading data, a boosted power supply voltage is applied to word line 66 to make word line 66 active. By the operation, N-channel MOS transistor 52 is turned on and a small voltage change appearing on bit line 68 in accordance with the charging state of capacitor 54 is detected by a not-illustrated sense amplifier and amplified to voltage Vcc or ground voltage GND. The voltage on bit line 68 corresponds to the state of stored data.

In a state where the voltage on bit line 68 is amplified to voltage Vcc or ground voltage GND, word line 66 is activated again to recharge capacitor 54 via N-channel MOS transistor 52, and storage data is rewritten by operations similar to (1) or (2).

In memory cell 50, as a voltage applied to word line 66 in the stored data reading operation, not a voltage obtained by boosting the power supply voltage but a voltage equal to or lower than the power supply voltage can be used.

If a voltage obtained by boosting the power supply voltage is used as a voltage applied to word line 66, data stored in memory cell 50 is destroyed in a data reading operation, and data has to be rewritten for the following reason. The potential of node 62 after data is read is determined by the capacity of bit line 68 and the capacity of capacitor 54. Since the capacity of bit line 68 is ten times as large as that of capacitor 54 or more, the potential of node 62 after data is read becomes close to the potential of bit line 68 more than the potential before data is read.

However, memory cell 50 in the present invention has, different from a general DRAM, charge compensating circuit 56. Charge compensating circuit 56 includes N-channel MOS transistor 604 connected to node 62. By the action of N-channel MOS transistor 604, the voltage to be applied to word line 66 can be set to the power supply voltage or lower without boosting the voltage of word line 66. The reason will be described hereinafter.

When data "0" is stored in memory cell 50, N-channel MOS transistor 604 is turned on, and N-channel MOS transistor 604 pulls charges from node 62 with the driving capability of 30 $\mu$A.

On the other hand, when data "1" is stored in memory cell 50, N-channel MOS transistor 604 is turned off and N-channel MOS transistor 604 does not pull charges from node 62.

Therefore, charge compensating circuit 56 in memory cell 50 also has the function of whether charges at node 62 are pulled out by N-channel MOS transistor 604 or not at the time of reading data. The function enables data to be read without perfectly transmitting the state of charges in capacitor 54 to bit line 68.

At the time of reading data, bit line 68 is precharged to power supply voltage Vcc. When reading of data "0" is performed, charges flowing in from bit line 68 via N-channel MOS transistor 52 are pulled by N-channel MOS transistor 604, so that even if the voltage of word line 66 is not boosted, the voltage of bit line 68 drops from power supply voltage Vcc to an extent that data "0" can be detected. On the other hand, a voltage change in node 62 is suppressed to a small range from 0V since N-channel MOS transistor 604 pulls charges on node 62.

That is, even if the voltage on word line 66 is not boosted, data "0" can be read and, without destroying the state of data "0", data can be read onto bit line 68.

Since the voltages on both bit line 68 and node 62 are power supply voltage Vcc before data "1" is read, when data "1" is read, the voltage on bit line 68 does not change. Therefore, by making the state where the voltage on bit line 68 does not change correspond to data "1", data "1" can be read out. Also, destruction of data associated with reading of data is not caused.

In such a manner, data is read/written from/to memory cell 50, and stored data can be non-destructively read without boosting the voltage on word line 66.

It is sufficient to determine the lower limit of a voltage applied to word line 66 so that, in relation to a cell ratio which will be described hereinafter, the current driving capability of N-channel MOS transistor 52 as an access transistor becomes equal to or higher than the half of the current driving capability of N-channel MOS transistor 604 as the driver transistor (the cell ratio is 2 or lower).

The reason why P-channel TFTs 582 and 602 are used for memory cell 50 is that P-channel TFTs 582 and 602 can be formed on N-channel MOS transistors 584 and 604. Although the area of N-channel MOS transistors 584 and 604 as bulk transistors is larger than the conventional DRAM, the number of bulk transistors in a memory cell is three. Thus, the cell area can be reduced as compared with a standard SRAM constructed by six bulk transistors.

Figure 5A:
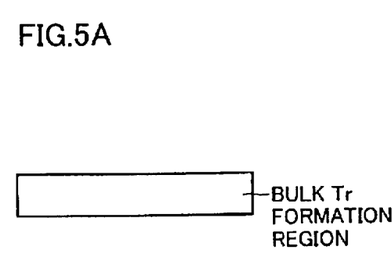
FIG. 5A is a schematic cross sectional view of a conventional memory cell which is shown from the area point of view.
Figure 5B:
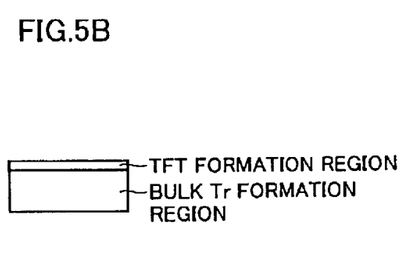
FIG. 5B is a schematic cross sectional view of a memory cell shown in FIG. 2 from the area point of view.

FIGS. 5A and 5B are schematic cross sectional views of a conventional memory cell and memory cell 50, respectively, from the area point of view in order to show an effect of reducing the area of memory cell 50 according to the first embodiment.

In memory cell 50 shown in FIG. 5B, P-channel TFTs 582 and 602 are formed on upper layers of N-channel MOS transistors 584 and 604 as bulk transistors. In memory cell 50, a bulk transistor forming area can be reduced by an amount corresponding to the smaller number of bulk transistors than the number in the conventional memory cell shown in FIG. 5A, consequently, the cell area is reduced.

In memory cell 50 according to the first embodiment, bulk transistors are formed of a transistor of one conductive type (N-channel MOS transistor), so that the cell area is reduced from this point as well.

Figure 6A:
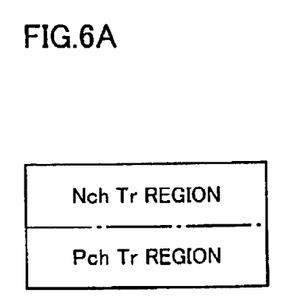
FIG. 6A is a plan view schematically showing an area in which bulk transistors in a memory cell of a 6-transistors SRAM are formed from the area point of view.
Figure 6B:
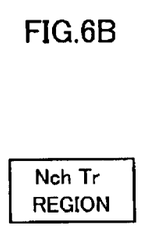
FIG. 6B is a plan view schematically showing an area in which a bulk transistor in memory cell shown in FIG. 2 is formed from the area point of view.

FIGS. 6A and 6B are plan views schematically showing a bulk transistor formation area in a memory cell of a 6-transistors SRAM and a bulk transistor formation area in memory cell 50, respectively, from the area point of view in order to show an effect of reducing the area of memory cell 50 according to the first embodiment.

The memory cell of the 6-transistors SRAM shown in FIG. 6A includes transistors of two kinds of conductive types, which are an N-channel MOS transistor and a P-channel MOS transistor, so that a P-well region in which the N-channel MOS transistor is formed and an N-well region in which the P-channel MOS transistor is formed have to be generated in a substrate. In contrast, memory cell 50 shown in FIG. 6B is formed only of the N-channel MOS transistor, so that it is unnecessary to provide two kinds of well regions. Therefore, the cell area is further reduced.

Further, as one of features of memory cell 50, the cell ratio can be set to a value close to 1 (ratioless).

The cell ratio denotes a current driving capability ratio between the driver transistors in memory cells (N-channel MOS transistors 702 and 704 in memory cells 700 and 750 of the SRAM shown in FIGS. 12 and 13 and N-channel MOS transistors 584 and 604 in memory cell 50 shown in FIG. 2) and access transistors (N-channel MOS transistors 706 and 708 in memory cells 700 and 750 in the SRAM shown in FIGS. 12 and 13 and N-channel MOS transistor 52 in memory cell 50 shown in FIG. 2). Generally, in an SRAM, to stabilize the operation of a memory cell, the cell ratio is set to 2 or 3 or higher. This means that the gate width of a driver transistor is set to be larger than that of an access transistor to assure a predetermined cell ratio in an SRAM.

On the other hand, in memory cell 50, by providing capacitor 54, the operation of the memory cell is stabilized as described above. It is therefore unnecessary to set the cell ratio to 2 or 3 or higher unlike an SRAM but the cell ratio can be basically set to ratioless. The lower cell ratio denotes that the gate width of the driver transistor can be reduced as compared with a conventional SRAM. From this point as well, further reduction in the cell area can be achieved.

When the stability of the operation of a memory cell is considered, in memory cell 50, it is unnecessary to set a cell ratio equivalent to that of the SRAM. However, in order to further increase stability of operation, it is desirable to set a some cell ratio.

Although the configuration using a TFT in charge compensating circuit 56 has been described above, a memory cell producing a similar effect can be also realized by using a resistor of high resistance in place of the TFT.

Figure 7:
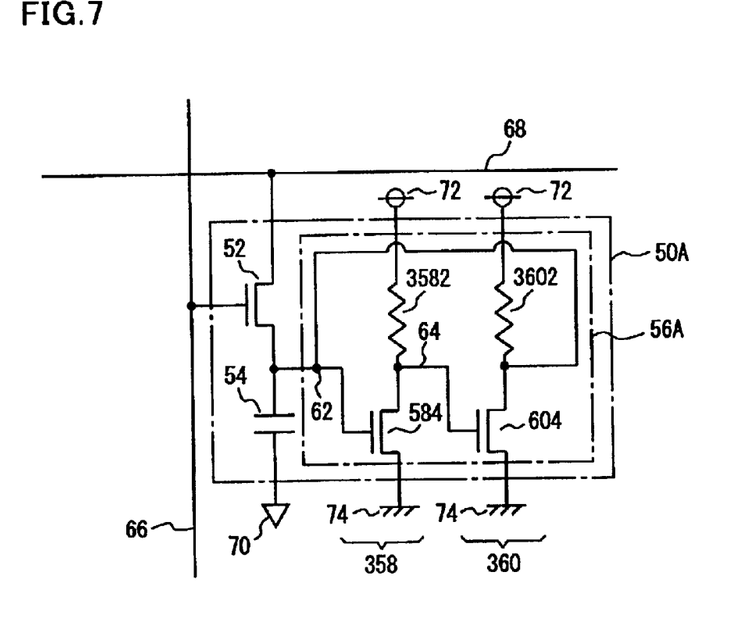
FIG. 7 is a circuit diagram showing another configuration of one of memory cells arranged in a matrix on the memory cell array in the semiconductor memory device according to the first embodiment.

FIG. 7 is a circuit diagram showing a circuit configuration of one of a memory cell 50A having a charge compensating circuit 56A including resistors 3582 and 3602 of high resistance in place of P-channel TFTs 582 and 602 in memory cell 50 in FIG. 2. Since the circuit configuration of memory cell 50A is similar to that of memory cell 50 except for resistors 3582 and 3602 of high resistance, its description will not be repeated.

Referring to FIG. 7, in a state where data "0" is written in memory cell 50A, the voltage at node 62 is 0V and the voltage at node 64 is a power supply voltage. In memory cell 50A, a current is always passed from power supply node 72 through resistor 3602 of high resistance and N-channel MOS transistor 604. If a resistor of a high resistance value is not used as resistor 3602 of high resistance, a current in a standby period in which data reading/writing operation is not performed (hereinafter, referred to as a standby current) increases. When a state where data "1" is written in memory cell 50A is considered, the above description can be also applied to resistor 3582 of high resistance.

On the other hand, in the case where data "0" is written in memory cell 50A, if the resistance value of resistor 3582 of high resistance is too high, a leak current from N-channel MOS transistor 584 becomes unignorable in node 64, and the potential at node 64 decreases. In the case where data "1" is written in memory cell 50A, the above description can be also applied with respect to resistor 3602 of high resistance and node 62.

Therefore, it is necessary to supply a current which is, at least, approximately ten times as high as the leak current from the resistor of high resistance in order to stabilize the state of node 64. When it is assumed that power supply voltage is 2V and the leak current is $1 \times 10^{-15}$A, to pass a current $1 \times 10^{-14}$ which is ten times as high as the leak current to resistor 3582 of high resistance, the resistance value of resistor 3582 of high resistance is sufficiently $2 \times 10^{14}$ Ω (ohm) or less. When the case where data "1" is written in memory cell 50A is considered, the resistance value of resistor 3602 of high resistance can be set in a manner similar to the above.

On the other hand, the upper limits of the resistance values of resistors 3602 and 3582 of high resistance are determined according to the specifications of memory capacity of semiconductor memory device on which memory cell 50A is mounted and the standby current. For example, when the memory capacity is 4M (mega, "M" indicating $10^6$) bits, to suppress the standby current to 10 μA, a current I flowing through the resistor of high resistance per memory cell is obtained by: $I = (10 \times 10^{-6} A)/(4 \times 10^6 \text{ bits}) = 2.5 \times 10^{-12}$A. Therefore, since the power supply voltage is 2V, the resistance value of resistors 3602 and 3582 of high resistance is obtained as $R = 2V/(2.5 \times 10^{-12} A) = 8 \times 10^{11}$ Ω.

From the above, under the above condition, the resistance value of resistors 3602 and 3582 of high resistance may be in a range from $8 \times 10^{11}$ Ω to $2 \times 10^{14}$ Ω.

As described above, the semiconductor memory device according to the first embodiment is constituted by using the memory cell of a conventional DRAM as a base and constituting the charge compensating circuit by using a P-channel TFT or a resistor of high resistance. Consequently, a memory cell which does not require refresh operations unlike a conventional DRAM, and of which cell area is reduced as compared with a conventional SRAM can be realized.

Second Embodiment

A semiconductor memory device 110 according to a second embodiment is different from semiconductor memory device 10 according to the first embodiment with respect to the configuration of a charge compensating circuit in a memory cell. A P-channel MOS transistor of the same conductive type as that of a bulk transistor in the charge compensating circuit is used as an access transistor.

The general configuration of semiconductor memory device 110 according to the second embodiment is the same as that of semiconductor memory device 10 according to the first embodiment shown in FIG. 1, so that its description will not be repeated.

Figure 8:
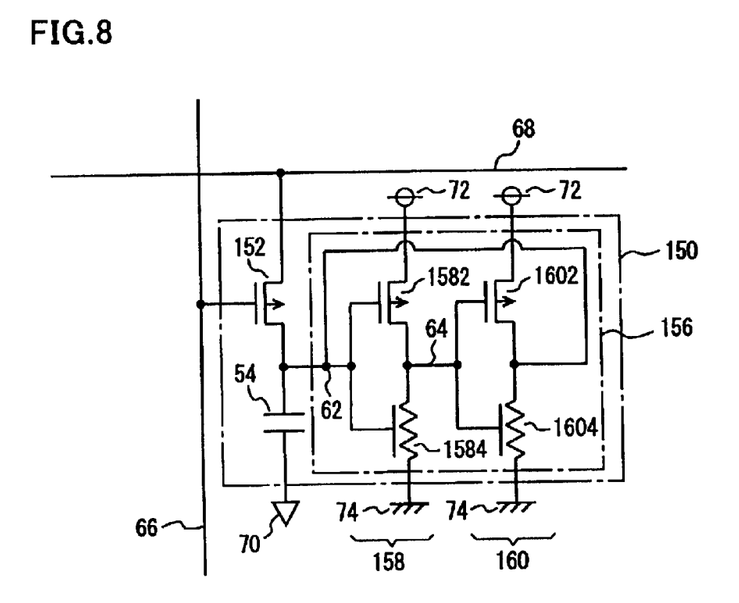
FIG. 8 is a circuit diagram showing the configuration of one of memory cells arranged in a matrix on a memory cell array in a semiconductor memory device according to a second embodiment.

FIG. 8 is a circuit diagram showing the configuration of one of memory cells arranged in a matrix on a memory cell array 36 in semiconductor memory device 110.

Referring to FIG. 8, a memory cell 150 on memory cell array 36 in semiconductor memory device 110 is provided with a P-channel MOS transistor 152 and a charge compensating circuit 156 in place of N-channel MOS transistor 52 and charge compensating circuit 56 in memory cell 50 of semiconductor memory device 10 according to the first embodiment. Charge compensating circuit 156 includes inverters 158 and 160 and nodes 62 and 64, inverter 158 is formed of a P-channel MOS transistor 1582 and an N-channel TFT 1584, and inverter 160 is formed of a P-channel MOS transistor 1602 and an N-channel TFT 1604.

Since the functions of capacitor 54 and the connection configurations of nodes 62 and 64 in memory cell 150 are the same as those in the first embodiment, their description will not be repeated.

P-channel MOS transistor 152 has a gate connected to word line 66, and a drain and a source connected to bit line 68 and capacitor 54, respectively. P-channel MOS transistor 152 is driven by word line 66 at which the voltage becomes 0V only when data is written or read, turned on only when data is written or read, and turned off at the other times.

The reason why the access transistor is used as P-channel MOS transistor 152 in the second embodiment is that, by constituting memory cell 150 by bulk transistors of one kind, as described in the first embodiment, it is unnecessary to provide two kinds of well regions, and the cell area can be accordingly reduced.

Each of N-channel TFTs 1584 and 1604 is a resistive element having a switching function, made of polycrystalline polysilicon, which is a high-resistive element having an OFF-state resistance of T (tera) Ω order and an ON-state resistance of G (giga) Ω order.

N-channel TFT 1584 has a gate connected to node 62, a drain connected to node 64 and a source connected to ground node 74. P-channel MOS transistor 1582 has a gate connected to node 62, a source connected to power supply node 72 and a drain connected to node 64.

N-channel TFT 1604 has a gate connected to node 64, a drain connected to node 62 and a source connected to ground node 74. P-channel MOS transistor 1602 has a gate connected to node 64, a source connected to power supply node 72 and a drain connected to node 62.

In memory cell 150, a leak current of capacitor 54 is compensated by a latch function achieved by inverter 158 formed of P-channel MOS transistor 1582 and N-channel TFT 1584 and inverter 160 formed of P-channel MOS transistor 1602 and N-channel TFT 1604, and stored data is held without performing refresh operations.

The operations of memory cell 150 will be described hereinafter.

(1) Writing of Data "1"

The operations and states of bit line 68 and capacitor 54 in a data writing operation are the same as those in the first embodiment. In a data reading operation, by application of zero voltage, word line 66 is activated. In a standby mode in which data is not read or written, a power supply voltage is applied to word line 66.

By applying voltage Vcc from bit line 68 to node 62 via P-channel MOS transistor 152, P-channel MOS transistor 1582 is turned off, and N-channel TFT 1584 is turned on. Therefore, node 64 is pulled down to the L level by N-channel TFT 1584. After that, it is regarded that the data writing operation is finished, the power supply voltage is applied to word line 66, and P-channel MOS transistor 152 is turned off.

When node 64 becomes L level, P-channel MOS transistor 1602 is turned on, and N-channel TFT 1604 is turned off. Node 62 is thereby strongly pulled up by P-channel MOS transistor 1602, immediately becomes H level, and is latched.

N-channel TFT 1584 has a poor driving capability due to the characteristics of a TFT. It takes time for N-channel TFT 1584 to pull down node 64. Consequently, it takes time until node 62 is latched at the H level by P-channel MOS transistor 1602. During the transient period, capacitor 54 holds charges. On completion of pulling down of node 64 by N-channel TFT 1584, node 62 is completely latched.

The OFF-state resistance of N-channel TFT 1604 is at the order of T (tera) Ω, and the OFF-state current is sufficiently lower than the leak current of capacitor 54, so that the above-described latch function is realized.

Therefore, even if charges leak from capacitor 54 for some reason, charges are compensated by P-channel MOS transistor 1602, and data "1" is held without requiring refresh operations.

(2) Writing of Data "0"

The operations and states of bit line 68 and capacitor 54 in a data writing operation are the same as those in the first embodiment. The operations and states of word line 66 and P-channel MOS transistor 152 are the same as those at the time of writing data "1".

When charges of capacitor 54 are discharged, node 62 becomes L level, P-channel MOS transistor 1582 is turned on, and N-channel TFT 1584 is turned off. Therefore, node 64 is strongly pulled up by P-channel MOS transistor 1582. After that, it is regarded that the data writing operation is finished, the power supply voltage is applied to word line 66, and P-channel MOS transistor 152 is turned off.

When node 64 becomes H level, P-channel MOS transistor 1602 is turned off, and N-channel TFT 1604 is turned on. N-channel TFT 1604 has a poor driving capability due to the characteristics of a TFT. It takes time for N-channel TFT 1604 to be completely turned on. During the transient period, capacitor 54 holds the state after the discharge. When N-channel TFT 1604 is completely turned on, node 62 is completely latched.

Therefore, even if charges leak from capacitor 54 for some reason, node 62 is held at the L level by N-channel TFT 1604, and stored data of the L level is held without requiring refresh operations.

Since the stored data reading operation is the same as that in the first embodiment, its description will not be repeated. Stored data in memory cell 150 is read/written in such manners.

N-channel TFTs 1584 and 1604 are used for memory cell 150 for a reason similar to the reason why P-channel TFTs 582 and 602 are used in the first embodiment. Specifically, N-channel TFTs 1584 and 1604 can be formed on upper layers of P-channel MOS transistors 582 and 602. Although the area of P-channel MOS transistors 582 and 602 as bulk transistors increases as compared with a conventional DRAM, the number of bulk transistors in a memory cell is three, so that the cell area can be reduced as compared with a standard SRAM constructed by six bulk transistors.

Although memory cell 150 uses P-channel MOS transistor 152 as an access transistor to further reduce the cell area, an N-channel MOS transistor may be used as an access transistor in a manner similar to the first embodiment. In this case, there is no effect of reducing the cell area achieved by constructing the memory cell by a one kind of well region. However, an effect of reducing the cell area by reducing the number of bulk transistors as compared with a 6-transistors SRAM is achieved.

As described above, the semiconductor memory device 110 according to the second embodiment is constituted by using the memory cell of a conventional DRAM as a base and constituting charge compensating circuit 156 by using an N-channel TFT, so that a memory cell which does not require refresh operations unlike a conventional DRAM, and of which cell area is reduced as compared with a conventional SRAM can be realized.

Third Embodiment

A semiconductor memory device 210 in a third embodiment has a different configuration of a charge compensating circuit in a memory cell from those in semiconductor memory devices 10 and 110 in the first and second embodiments.

A general configuration of semiconductor memory device 210 according to the third embodiment is the same as that of semiconductor memory device 10 according to the first embodiment shown in FIG. 1, so that its description will not be repeated.

Figure 9:
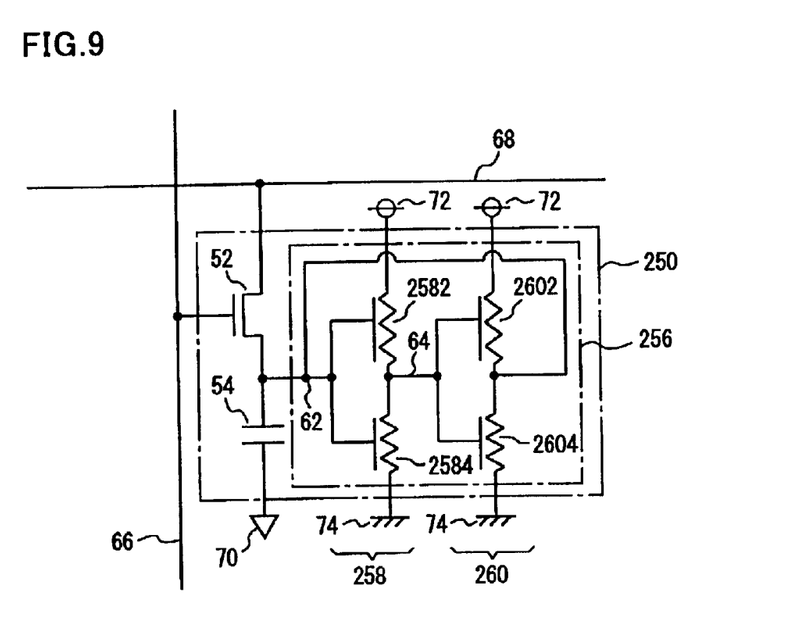
FIG. 9 is a circuit diagram showing the configuration of one of memory cells arranged in a matrix on a memory cell array in a semiconductor memory device according to a third embodiment.

FIG. 9 is a circuit diagram showing the configuration of one of memory cells arranged in a matrix on memory cell array 36 in semiconductor memory device 210.

Referring to FIG. 9, memory cell 250 on memory cell array 36 in semiconductor memory device 210 is provided with a charge compensating circuit 256 in place of charge compensating circuit 56 in memory cell 50 of semiconductor memory device 10 according to the first embodiment. Charge compensating circuit 256 includes inverters 258 and 260 and nodes 62 and 64, inverter 258 is formed of a P-channel TFT 2582 and an N-channel TFT 2584, and inverter 260 is formed of a P-channel TFT 2602 and an N-channel TFT 2604.

Since the configuration and functions of N-channel MOS transistor 52 and capacitor 54 and the connection configurations of nodes 62 and 64 as a part other than charge compensating circuit 256 in memory cell 250 are the same as those in the first embodiment, their description will not be repeated.

Each of P-channel TFTs 2582 and 2602 and N-channel TFTs 2584 and 2604 is a resistive element having a switching function, made of polycrystal polysilicon, which is a high-resistive element having an OFF-state resistance of T (tera) Ω order and an ON-state resistance of G (giga) Ω order.

P-channel TFT 2582 has a gate connected to node 62, a source connected to power supply node 72 and a drain connected to node 64. N-channel TFT 2584 has a gate connected to node 62, a drain connected to node 64 and a source connected to ground node 74.

P-channel TFT 2602 has a gate connected to node 64, a source connected to power supply node 72, and a drain connected to node 62. N-channel TFT 2604 has a gate connected to node 64, a drain connected to node 62 and a source connected to ground node 74.

In memory cell 250, a leak current of capacitor 54 is compensated by a latch function achieved by inverter 258 formed of P-channel TFT 2582 and N-channel TFT 2584 and inverter 260 formed of P-channel TFT 2602 and N-channel TFT 2604, and stored data is held without performing refresh operations.

The operations of memory cell 250 will be described hereinafter.

In the third embodiment, since charge compensating circuit 256 is formed only of TFTs, time about twice as long as that in the first and second embodiments is required for a period since N-channel MOS transistor 52 is turned on until node 62 is completely latched by inverters 258 and 260. However, for the time of the order required to turn on/off the TFT, capacitor 54 can sufficiently hold charges.

As described in the first embodiment, the ON-state current of a TFT is sufficiently higher than the leak current of the capacitor, and the OFF-state current is sufficiently low. Therefore, even when charge compensating circuit 256 is constituted only by TFTs, the latch function can be realized.

Since the stored data reading operation is the same as that in the first embodiment, its description will not be repeated.

In memory cell 250, the number of bulk transistors is one which is N-channel MOS transistor 52. As compared with a standard SRAM constituted by six bulk transistors, the cell area can be largely reduced.

As described above, semiconductor memory device 210 according to the third embodiment is constituted by using the memory cell of a conventional DRAM as a base and constituting charge compensating circuit 256 by using a P-channel TFT and an N-channel TFT, so that a memory cell which does not require refresh operations unlike a conventional DRAM, and of which cell area is largely reduced as compared with a conventional SRAM can be realized.

Fourth Embodiment

A semiconductor memory device 310 in a fourth embodiment has a memory cell having a configuration similar to that of memory cell 50 in semiconductor memory device 10 according to the first embodiment except that N-channel MOS transistor 604 in charge compensating circuit 56 is not provided.

A general configuration of semiconductor memory device 310 according to the fourth embodiment is the same as that of semiconductor memory device 10 according to the first embodiment shown in FIG. 1, so that its description will not be repeated.

Figure 10:
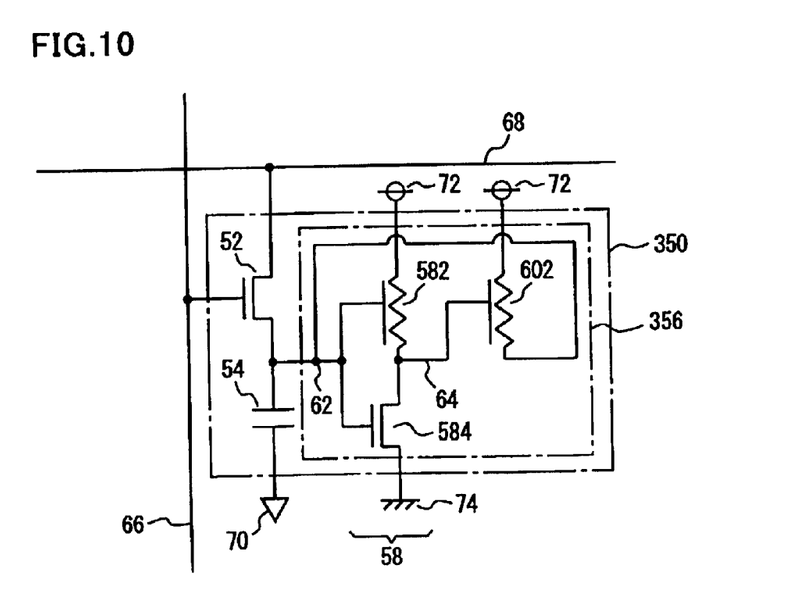
FIG. 10 is a circuit diagram showing the configuration of one of memory cells arranged in a matrix on a memory cell array in a semiconductor memory device according to a fourth embodiment.

FIG. 10 is a circuit diagram showing the configuration of one of memory cells arranged in a matrix on memory cell array 36 in semiconductor memory device 310.

Referring to FIG. 10, a memory cell 350 on memory cell array 36 in semiconductor memory device 310 is provided with a charge compensating circuit 356 in place of charge compensating circuit 56 in memory cell 50 of semiconductor memory device 10 according to the first embodiment. Charge compensating circuit 356 has a configuration similar to that of charge compensating circuit 56 in the first embodiment except that N-channel MOS transistor 604 is not provided. Since the other configuration in charge compensating circuit 356 is the same as that of charge compensating circuit 56, its description will not be repeated.

Since the configuration and functions of N-channel MOS transistor 52 and capacitor 54 and the connection configurations of nodes 62 and 64 as a part other than charge compensating circuit 356 in memory cell 350 are the same as those in the first embodiment, their description will not be repeated.

In memory cell 350, a leak current of capacitor 54 is compensated by a latch function achieved by P-channel TFT 602 and inverter 58 formed of P-channel TFT 582 and N-channel MOS transistor 584, and stored data is held without performing refresh operations.

The operations of memory cell 350 will be described hereinafter.

(1) Writing of Data "1"

The operations and states of bit line 68, word line 66, N-channel MOS transistor 52, and capacitor 54 in a data writing operation are the same as those in the first embodiment.

By applying voltage Vcc from bit line 68 to node 62 via N-channel MOS transistor 52, P-channel MOS transistor 582 is turned off, and N-channel MOS transistor 584 is turned on. Therefore, node 64 is strongly pulled down by N-channel MOS transistor 584 and immediately becomes L level. After that, it is regarded that the data writing operation is finished, word line 66 is made inactive, and N-channel MOS transistor 52 is turned off.

When node 64 becomes L level, P-channel TFT 602 is turned on. At this time, P-channel TFT 602 has a poor driving capability due to the characteristics of a TFT and it takes time for P-channel TFT 602 to be completely turned on. During the transient period, capacitor 54 holds charges. When P-channel TFT 602 is completely turned on, node 62 is completely latched.

As described above, even if charges leak from capacitor 54 for some reason, charges are compensated by P-channel TFT 602, and data "1" is held without requiring refresh operations.

(2) Writing of Data "0"

The operations and states of bit line 68, word line 66, N-channel MOS transistor 52, and capacitor 54 in a data writing operation are the same as those in the first embodiment.

When charges of capacitor 54 are discharged, node 62 becomes L level, P-channel TFT 582 is turned on, and N-channel MOS transistor 584 is turned off. Therefore, node 64 is pulled up to the H level by P-channel TFT 582. After that, it is regarded that the data writing operation is finished, word line 66 is made inactive, and N-channel MOS transistor 52 is turned off.

When node 64 becomes H level, P-channel TFT 602 is turned off. Therefore, node 62 maintains the L level.

In this case, since charge compensating circuit 356 does not have an N-channel MOS transistor for strongly latching node 62 at the L level, a current leak to capacitor 54 due to the OFF-state current of P-channel TFT 602 may occur. However, since the OFF-state resistance of P-channel TFT 602 is at the order of T (tera) Ω, and the OFF-state current of P-channel TFT 602 is sufficiently lower than the leak current exerting an influence on the storing state of capacitor 54, without providing N-channel MOS transistor 604, node 62 is latched at the L level.

Since a basic stored data reading operation is the same as that in the first embodiment, its description will not be repeated. Charge compensating circuit 356 in the fourth embodiment is not provided with N-channel MOS transistor 604 in charge compensating circuit 56 in the first embodiment, so that charge compensating circuit 356 does not have an effect of pulling charges by N-channel MOS transistor 604 as described in the first embodiment. In the fourth embodiment, therefore, the voltage in word line 66 cannot be lowered as in the first embodiment. In semiconductor memory device 310, in a manner similar to a general DRAM, a voltage obtained by boosting the power supply voltage is applied to word line 66.

Stored data in memory cell 350 is read/written in such manners.

In memory cell 350, the number of bulk transistors is two, so that the cell area can be largely reduced as compared with a standard SRAM formed of six bulk transistors.

Although not shown, an N-channel TFT may be used in place of N-channel MOS transistor 584 in charge compensating circuit 356. In this case, one more bulk transistor can be reduced, and further reduction in the cell area can be realized.

As described above, semiconductor memory device 310 according to the fourth embodiment is constituted by using the memory cell of a conventional DRAM as a base and constituting charge compensating circuit 356 by using a P-channel TFT, so that a memory cell which does not require refresh operations unlike a conventional DRAM, and of which cell area is largely reduced as compared with a conventional SRAM can be realized.

Although a capacitive element is connected to N-channel MOS transistor 52 as an access transistor in the first to fourth embodiments, for example, when the current driving capability of N-channel MOS transistor 604 shown in FIG. 2 is high (when the cell ratio of N-channel MOS transistors 604 and 52 is higher than 2), the capacitive element may be provided for node 64.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
  a memory cell array including a plurality of memory cells arranged in a matrix; and
  a plurality of word lines and a plurality of bit lines arranged in correspondence with rows and columns of said memory cells, respectively, wherein
  each of said plurality of memory cells includes:
    a capacitive element for holding charges according to a logic level of data of one bit of stored information expressed by binary information;
    an access transistor driven by a voltage applied to said word line, for transferring said charges between said bit line and said capacitive element; and
    a charge compensating circuit for compensating charges leaked from said capacitive element in accordance with the logic level of said data.

2. The semiconductor memory device according to claim 1, wherein
  said charge compensating circuit is connected between said capacitive element and said access transistor.

3. The semiconductor memory device according to claim 2, wherein said charge compensating circuit includes:
a first inverter having an input node connected to a storage node provided between said capacitive element and said access transistor; and
a second inverter having an input node connected to an output node of said first inverter, and having an output node connected to said storage node.

4. The semiconductor memory device according to claim 3, wherein
said storage node has a capacity larger than a capacity of said output node of said first inverter.

5. The semiconductor memory device according to claim 4, wherein
the capacity of said storage node is equal to or larger than five times as large as the capacity of said output node of said first inverter.

6. The semiconductor memory device according to claim 3, wherein
MOS transistors included in said first and second inverters are an MOS transistor of the same conductive type as that of said access transistor.

7. The semiconductor memory device according to claim 6, wherein
said access transistor is a first N-channel MOS transistor, and
each of said first and second inverters has:
a resistive element, made of polycrystalline polysilicon, which has one end connected to a power supply node and has other end connected to an output node; and
a second N-channel MOS transistor having a drain connected to the output node and having a source connected to a ground node.

8. The semiconductor memory device according to claim 7, wherein
a current driving capability of said second N-channel MOS transistor is in a range from a current driving capability of said first N-channel MOS transistor to a current driving capability twice as high as that of said first N-channel MOS transistor inclusive.

9. The semiconductor memory device according to claim 7, wherein
said resistive element is formed of a P-channel thin film transistor.

10. The semiconductor memory device according to claim 9, wherein
the capacity of said storage node is equal to or larger than twenty times as large as the capacity of said output node of said first inverter.

11. The semiconductor memory device according to claim 7, wherein
said resistive element has a capability of supplying a current ten times as high as a leak current of said storage node or higher.

12. The semiconductor memory device according to claim 7, wherein
when said data is read from each of said plurality of memory cells,
a bit line corresponding to each of said plurality of memory cells is precharged to a power supply voltage, and
a voltage equal to or lower than said power supply voltage is applied to a word line corresponding to each of said plurality of memory cells.

13. The semiconductor memory device according to claim 12, wherein
said voltage applied to the word line corresponding to each of said plurality of memory cells is set so that a current driving capability of said access transistor becomes equal to or higher than the half of a current driving capability of said second N-channel MOS transistor.

14. The semiconductor memory device according to claim 6, wherein
said access transistor is a first P-MOS transistor, and
each of said first and second inverters includes:
a second P-channel MOS transistor having a source connected to a power supply node and having a drain connected to an output node; and
a resistive element, made of polycrystalline polysilicon, which has one end connected to the output node and has other end connected to a ground node.

15. The semiconductor memory device according to claim 14, wherein
said resistive element is formed of an N-channel thin film transistor.

16. The semiconductor memory device according to claim 3, wherein
each of said first and second inverters has:
a first resistive element, made of polycrystalline polysilicon, which has one end connected to a power supply node and has other end is connected to an output node; and
a second resistive element, made of polycrystalline polysilicon, which has one end connected to the output node and has other end connected to a ground node.

17. The semiconductor memory device according to claim 16, wherein
said first resistive element is formed of a P-channel thin film transistor, and
said second resistive element is formed of an N-channel thin film transistor.

18. The semiconductor memory device according to claim 2, wherein
said access transistor is a first N-channel MOS transistor,
said charge compensating circuit includes:
an inverter having an input node connected to a storage node provided between said capacitive element and said access transistor; and
a first resistive element which has one end connected to a power supply node and has other end connected to said storage node, switches a characteristic of a current from said power supply node to said storage node in accordance with a signal output from an output node of said inverter, and is made of polycrystalline polysilicon, and
said inverter has:
a second resistive element, made of polycrystalline polysilicon, which has one end connected to a power supply node and has other end connected to said output node; and
a second N-channel MOS transistor having a drain connected to said output node and having a source connected to a ground node.

19. The semiconductor memory device according to claim 18, wherein
each of said first and second resistive elements is formed of P-channel thin film transistor.

* * * * *